United States Patent [19]
Takeda et al.
[11] 3,847,677
[45] Nov. 12, 1974

[54] METHOD OF MANUFACTURING SEMICONDUCTOR DEVICES

[75] Inventors: Tadashi Takeda, Touyo; Yukiyoshi Nakazawa, Tokyo; Hiroshi Ikeda, Yamanashi-ken,, Japan

[73] Assignee: Hitachi, Ltd., Tokyo, Japan

[22] Filed: Jan. 24, 1973

[21] Appl. No.: 326,493

[30] Foreign Application Priority Data
Jan. 24, 1972 Japan .................................. 47-8351

[52] U.S. Cl. .................. 148/1.5, 148/175, 148/189, 148/191, 317/235 R
[51] Int. Cl. .............................................. H01l 7/54
[58] Field of Search ............ 148/191, 1.5, 175, 189; 317/235 E, 48.9

[56] References Cited
UNITED STATES PATENTS

| | | | |
|---|---|---|---|
| 3,260,902 | 7/1966 | Porter | 148/175 UX |
| 3,431,150 | 3/1969 | Dolan et al. | 148/1.5 |
| 3,502,951 | 3/1970 | Hunts | 317/235 R |
| 3,655,457 | 4/1972 | Duffy et al. | 148/1.5 |
| 3,663,872 | 5/1972 | Yanagawa | 317/235 R |
| 3,752,715 | 8/1973 | Antipov et al. | 148/187 |
| 3,761,786 | 9/1973 | Imaizumi et al. | 317/235 R |

*Primary Examiner*—G. Ozaki
*Attorney, Agent, or Firm*—Craig & Antonelli

[57] ABSTRACT

An improved process for the manufacture of a semiconductor device having a plurality of bipolar type semiconductor elements formed on a substrate and isolated from each other by diffusion layers. Each diffusion layer is formed by a diffusion layer diffused from an impurity source buried in the substrate into a semiconductor layer epitaxially grown on the substrate and another diffusion layer diffused from the surface of the epitaxially grown semiconductor layer until it is combined with the first-mentioned diffusion layer.

7 Claims, 6 Drawing Figures

METHOD OF MANUFACTURING SEMICONDUCTOR DEVICES

This invention relates to methods of manufacturing semiconductor devices and, more particularly, to the method of forming isolation layers in the manufacture of bipolar type semiconductor integrated circuits.

In the manufacture of bipolar type semiconductor integrated circuits (hereinafter referred to as bipolar type ICs) having a plurality of bipolar semiconductor elements formed on the same semiconductor substrate, it is necessary to form an isolation layer to electrically isolate the individual elements one from another.

A method usually adopted in the manufacture of the bipolar type ICs consists of forming, for instance, $N^+$-type buried layers through selective diffusion in a P-type semiconductor substrate to the end of reducing the collector series resistance, epitaxially growing an N-type semiconductor layer (hereinafter referred to as an EP growth layer) on the resultant semiconductor wafer, selectively diffusing an acceptor impurity into the EP growth layer to form a P-type diffusion layer reaching the P-type substrate and serving as an isolation layer, and then forming semiconductor elements in respective N-type semiconductor regions separated by the isolation layer through necessary selective diffusion treatments.

However, the EP growth layer formed on the substrate is usually as thick as 6 to 20 microns, so that a long time of several tens of hours has been required for the diffusion treatment to form the isolation layer reaching the substrate.

To reduce such a long diffusion treatment time, it has been proposed to previously form a P-type superficial diffusion layer of high impurity concentration in part of a P-type semiconductor substrate corresponding to the location of an isolation layer to be subsequently formed, so that a P-type diffusion layer formed through impurity diffusion from the aforementioned high impurity concentration P-type diffusion layer serving as an impurity source into an EP growth layer of N-conductivity type subsequently formed on the semiconductor substrate may be combined with another P-type diffusion layer formed by diffusing an acceptor impurity into the EP growth layer from the surface thereof. The combined diffusion layers serve as an isolation layer. In the above way, since a P-type diffusion layer is formed through impurity diffusion from the $P^+$-type diffusion layer serving as the impurity source within the substrate into the EP growth layer at the time of formation thereof and extends into the EP growth layer to a certain depth, the impurity diffusion from the surface of the EP growth layer thereinto after the formation thereof may be shallower than the case of absence of the firstmentioned P-type diffusion layer. Thus, it is possible to reduce the time required for the formation of the isolation layer.

The above method, however, has a drawback in that due to a high temperature treatment (at a temperature of 1,150° to 1,200°C) for the formation of the EP growth layer on the substrate surface, the P-type high concentration impurity in the $P^+$-type superficial diffusion layer tends to get into the gas phase through evaporation and be doped into other superficial portions of the substrate. This phenomenon is commonly termed auto-doping and gives rise to the formation of a P-type inversion layer along the entire boundary between substrate and EP growth layer. Also, the evaporated impurity is partly diffused into $N^+$-type buried layers to result in the reduction of the collector series resistance.

The present invention is intended to overcome the above problems, and its object is to provide a method of manufacturing semiconductor devices, for which the time required for the formation of the isolation layer may be reduced.

An essential feature of the invention to achieve the above object is constituted by the step of implanting an impurity into part of a semiconductor substrate of a first conductivity type to form a buried layer of the first conductivity type having a greater impurity concentration than that of the substrate and not contiguous to a first principal surface of said substrate, the step of epitaxially growing a semiconductor layer of a second conductivity type on the first principal surface of said substrate and the step of selectively diffusing an impurity into the second impurity type semiconductor layer from a surface portion thereof corresponding to the buried layer to form a diffusion layer of the first conductivity type, the first conductivity type diffusion layer being combined with another diffusion from the first conductivity type buried layer serving as an impurity source into the second conductivity type semiconductor layer at the time of epitaxially growing the second conductivity type semiconductor layer or through a drive-in-diffusion treatment.

In accordance with the invention, at the time of forming the EP growth layer on the semiconductor substrate the impurity of the buried layer formed by implanting the impurity into the substrate and serving as an impurity source is diffused into the EP growth layer, so that the resultant diffusion layer may be utilized as the isolation layer. Thus, the diffusion depth from the surface of the EP growth layer, and hence the time of the diffusion treatment for the formation of the isolation layer, may be reduced. Also, since the buried layer formed by implanting the impurity into the semiconductor substrate is not contiguous to the surface thereof, the low impurity concentration semiconductor layer covering the buried layer acts to prevent the diffusion of the buried impurity into the boundary between the substrate and EP growth layer at the time of formation of the EP layer, thus effectively preventing the formation of the inversion layer.

The invention will now be described in conjunction with a preferred embodiment thereof.

Figure 1A:
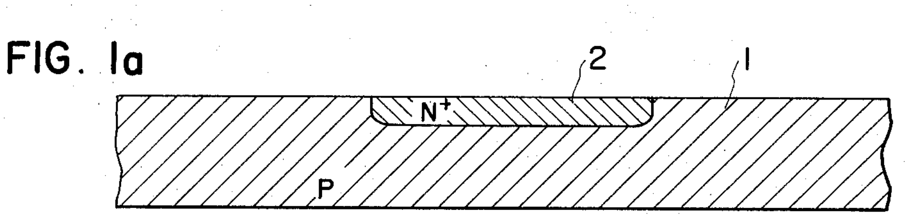
FIGS. 1*a* to 1*e* are sectional views showing successive steps of a method embodying the invention.

In the step depicted by FIG. 1*a*, a donor impurity, for instance arsenic (As), is selectively diffused into a P-type semiconductor substrate 1 to form a $N^+$-type superficial buried layer 2 (having a thickness of about 2 to 7 microns). This $N^+$-type buried layer is provided to reduce the collector series resistance, and should have a greater impurity concentration than an N-type EP growth layer to be formed subsequently.

Figure 1B:
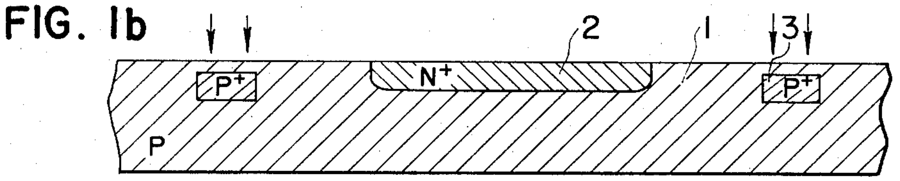

In the next step of FIG. 1*b*, a $P^+$-type buried layer 3 is formed within the P-type semiconductor substrate through ion implantation techniques, for instance, by implanting boron as an acceptor impurity into the substrate.

The buried layer 3 formed through the ion implantation of the impurity may initially have a small thickness and large impurity concentration, and may subsequently be modified into a suitable thickness through a drive-in-diffusion technique.

The $P^+$-type buried layer 3 is formed such that it is spaced from the surface of the substrate 1 by about 0.5 to 3 microns. The formation of the buried layer is impossible with the usual diffusion techniques. With ion implantation techniques, however, the introduction of the impurity into the substrate may be readily controlled to obtain a desired impurity distribution and configuration of the buried layer by controlling the ion accelerating voltage, ion beam sweep and the quantity of the introduced impurity. Also, the buried layer may be formed with high reliability since the quantity of the introduced impurity can be monitored throughout the implantation process from the measurement of the ion beam current. Further, since the impurity doping can be done by maintaining the semiconductor substrate at a low temperature, the deterioration of the semiconductor element due to the introduction of the impurity may be avoided.

Figure 1C:
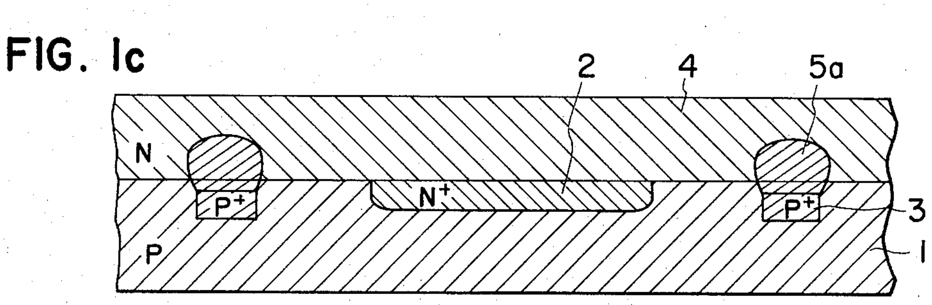

In the subsequent step of FIG. 1*c*, an N-type semiconductor layer 4 (as thick as about 6 to 20 microns) is formed on the semiconductor substrate 1 through the EP growth method. Since the $P^+$-type buried layer 3 has a very high impurity concentration, it acts as an impurity source, and impurity out-diffusion from this source into the N-type semiconductor layer is effected due to the high temperature at the time of epitaxially growing the N-type semiconductor layer, thus forming a P-type diffusion layer 5*a*. Also, since the $P^+$-type diffusion layer 3 is not contiguous to the surface of the substrate 1 but is covered with part of the low impurity concentration substrate 1, the prior-art drawback of the auto-doping phenomenon can be prevented to prevent the formation of an inversion layer along the boundary between the substrate 1 and the EP growth layer 4.

Figure 1D:
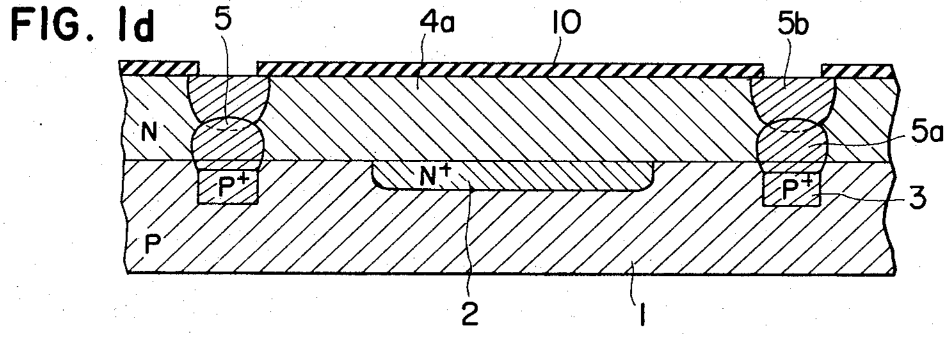

In the subsequent step of FIG. 1*d*, an acceptor impurity, for instance boron, is diffused into the N-type semiconductor layer 4 from a surface portion thereof corresponding to the diffusion layer 5*a* to form a diffusion layer 5*b* combined with the diffusion layer 5*a*, to overlap at 5. On the surface of EP growth layer 4 is an insulating film 10.

Figure 2:
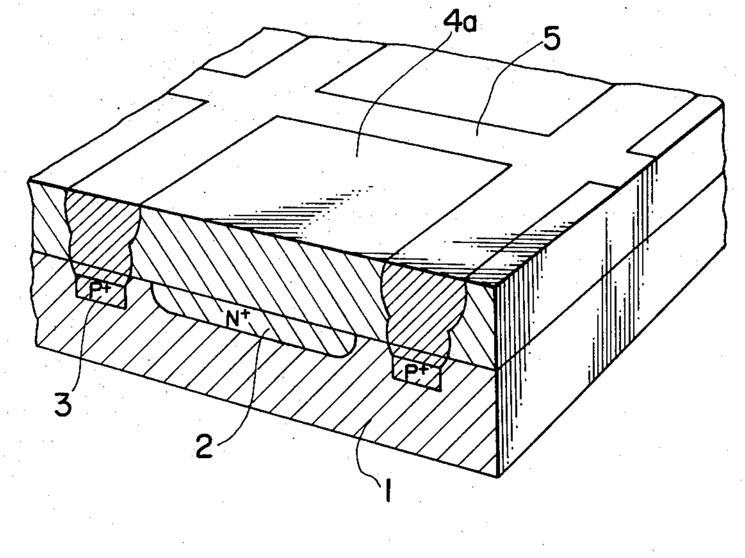
FIG. 2 shows part of a semiconductor chip after the isolation process.

In this way, an N-type semiconductor region 4*a* is isolated by the diffusion layers 5*a* and 5*b*, which constitute an isolation layer. Thus, it is possible to obtain a semiconductor wafer as shown in FIG. 2. Since the diffusion layer 5*a* is formed at the time of formation of the EP growth layer and since the diffusion layer 5*b* need only have a diffusion depth sufficient to reach the diffusion layer 5*a*, the time required for the formation of the isolation layer may be short compared to the case of the prior art.

Figure 1E:
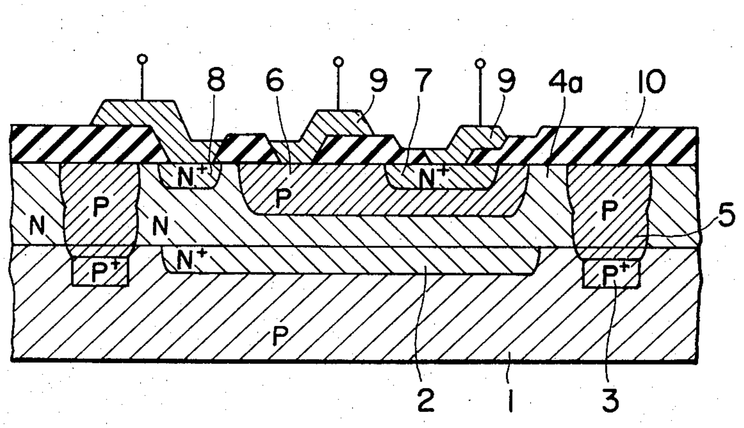

Afterwards, necessary selective diffusion treatments utilizing photo-etching techniques are carried out to form a base region 6, an $N^+$ high impurity concentration emitter region 7 and a high impurity concentration $N^+$ collector electrode contact or take-out region 8, each having an impurity concentration greater than that of the N-type semiconductor region 4*a*, with the remaining portion of the N-type semiconductor region 4*a* used as collector region, and finally the electrode wiring 9 is provided to complete the element, as shown in FIG. 1*e*.

The aforementioned embodiment is by no means limitative, but the invention may be applied to whatever type of isolation is desired in the manufacture of semiconductor devices.

As has been described, according to the invention, it is possible to reduce the time required for the formation of the isolation layer, to eventually prevent the deterioration of the semiconductor with the reduction of the high temperature treatment time and to prevent the formation of the invention layer along the boundary between the substrate and EP growth layer. These various effects are very useful in industry.

What we claim is:

1. In a method of manufacturing a semiconductor device, the improvement comprising the steps of:
  a. implanting an impurity into at least one prescribed portion of a semiconductor substrate of a first conductivity type to form at least one buried layer of said first conductivity type, said buried layer having a greater impurity concentration than that of said substrate while being non-contiguous to a principal surface of said substrate;
  b. epitaxially growing a semiconductor layer of a second conductivity type, opposite said first conductivity type, on said principal surface of said substrate; and
  c. selectively diffusing an impurity into said semiconductor layer to form a first diffusion layer of said first conductivity type in said semiconductor layer which diffuses to a depth to become contiguous with a second diffusion layer which has formed from the outdiffusion of the impurity in said at least one prescribed portion of said substrate through said substrate and into said semiconductor layer formed on the principal surface thereof, thereby forming an inactive isolation region extending through said semiconductor layer.

2. A method according to claim 1, wherein step (b) comprises the steps of epitaxially growing said layer on said principal surface of said substrate while simultaneously outdiffusing the impurity in said at least one prescribed portion of said substrate from said portion through said substrate toward the principal surface thereof on which epitaxial growth is taking place.

3. A method according to claim 2, further comprising the step of diffusing an impurity of said second conductivity type into said substrate through the principal surface thereof prior to said step (a) to form a diffused surface region in said substrate, said diffused surface region having an impurity concentration greater than that of said epitaxially grown semiconductor layer.

4. A method according to claim 3, further comprising the steps of selectively diffusing an impurity into the surface of said semiconductor layer to form a base diffusion layer therein of said first conductivity type, selectively diffusing an emitter and a collector contact diffusion layer of said second conductivity type and of a higher impurity concentration than said epitaxially grown semiconductor layer in said epitaxially grown layer and in said base diffusion layer respectively, and forming electrode contacts on said base, emitter and collector contact diffusion layers.

5. A method according to claim 1, wherein step (a) comprises implanting said impurity to form said at least one buried layer with a prescribed impurity concentration and thickness, and wherein said method further includes the step of effecting a drive-in diffusion of the impurity in said layer into said substrate so as to controllably modify the thickness thereof, prior to said step (b).

6. A method according to claim 5, wherein step (b) comprises the steps of epitaxially growing said layer on said principal surface of said substrate while simultaneously outdiffusing the impurity in said at least one prescribed portion of said substrate from said portion through said substrate toward the principal surface thereof on which epitaxial growth is taking place.

7. A method according to claim 1, wherein step (a) comprises implanting an ion impurity into said substrate while monitoring the ion beam current.

* * * * *